(12) United States Patent
Birsan et al.

(10) Patent No.: US 10,049,071 B2
(45) Date of Patent: *Aug. 14, 2018

(54) PROGRAMMABLE LOGIC UNIT

(71) Applicant: Atmel Corporation, San Jose, CA (US)

(72) Inventors: Laurentiu Birsan, Saint Herblain (FR); Stein Danielsen, Flatasen (NO)

(73) Assignee: Atmel Corporation, San Jose, CA (US)

( * ) Notice: Subject to any disclaimer, the term of this patent is extended or adjusted under 35 U.S.C. 154(b) by 451 days.

This patent is subject to a terminal disclaimer.

(21) Appl. No.: 14/795,806

(22) Filed: Jul. 9, 2015

(65) Prior Publication Data

US 2015/0309957 A1 Oct. 29, 2015

Related U.S. Application Data

(63) Continuation of application No. 13/858,757, filed on Apr. 8, 2013, now Pat. No. 9,083,339, which is a
(Continued)

(51) Int. Cl.
*H03K 19/17* (2006.01)
*G06F 13/42* (2006.01)
(Continued)

(52) U.S. Cl.
CPC .......... *G06F 13/4221* (2013.01); *G06F 13/00* (2013.01); *G06F 13/40* (2013.01);
(Continued)

(58) Field of Classification Search
CPC ....... H03K 19/17736; H03K 19/17704; H03K 19/17728; H03K 19/17744;
(Continued)

(56) References Cited

U.S. PATENT DOCUMENTS 6,181,174 B1 * 1/2001 Fujieda ..................... G06F 1/08
327/158
6,275,065 B1 8/2001 Mendel
(Continued)

OTHER PUBLICATIONS

U.S. Appl. No. 13/858,757, USPTO Non-Final Office Action dated Nov. 26, 2014, 8 pages.
(Continued)

*Primary Examiner* — Vibol Tan
(74) *Attorney, Agent, or Firm* — Fish & Richardson P.C.

(57) ABSTRACT

Programmable logic units are described. A described unit includes one or more input interfaces to receive one or more input signals; logic elements that are individually programmable; one or more output interfaces to provide one or more output signals; and a programmable interconnect array that is configured to selectively form one or more interconnections within the unit based on one or more programming settings. The programmable interconnect array can be programmable to route the one or more input signals from the one or more input interfaces to at least a portion of the logic elements, programmable to route one or more intermediate signals among at least a portion of the logic elements, and programmable to route one or more signals from at least a portion of the logic elements to produce the one or more output signals via the output interface.

18 Claims, 14 Drawing Sheets

Related U.S. Application Data continuation of application No. 13/304,287, filed on Nov. 23, 2011, now Pat. No. 8,415,975.

(51) Int. Cl.
*H03K 19/177* (2006.01)
*G06F 13/00* (2006.01)
*G06F 13/40* (2006.01)

(52) U.S. Cl.
CPC ..... *H03K 19/177* (2013.01); *H03K 19/17704* (2013.01); *H03K 19/17728* (2013.01); *H03K 19/17736* (2013.01)

(58) Field of Classification Search
CPC ............ H03K 19/1737; H03K 19/177; H03K 19/17796; H03K 19/1733; G06F 15/7867; G06F 17/5054
See application file for complete search history.

(56) References Cited

U.S. PATENT DOCUMENTS

| | | | |
|---|---|---|---|
| 6,340,897 B1 | 1/2002 | Lytle et al. | |
| 6,362,646 B1 | 3/2002 | Schleicher | |
| 6,774,672 B1 | 8/2004 | Lien et al. | |
| 6,810,513 B1 | 10/2004 | Vest | |
| 6,898,101 B1 | 5/2005 | Mann | |
| 7,058,880 B1 | 6/2006 | Ding et al. | |
| 7,161,384 B1 | 1/2007 | Lin et al. | |
| 7,480,165 B1 | 1/2009 | Mann | |
| 7,575,561 B2 * | 8/2009 | Smith | A61F 13/06 602/60 |
| 7,576,561 B1 | 8/2009 | Huang | |
| 7,818,705 B1 * | 10/2010 | Hutton | G06F 17/5054 716/113 |
| 8,415,975 B1 | 4/2013 | Birsan et al. | |
| 8,773,164 B1 | 7/2014 | Gaide et al. | |
| 9,083,339 B2 | 7/2015 | Birsan et al. | |
| 2012/0027026 A1 * | 2/2012 | Duwel | H04J 3/04 370/465 |

OTHER PUBLICATIONS

U.S. Appl. No. 13/858,757, USPTO notice of allowance dated Mar. 13, 2015.

* cited by examiner

| IN[0] | IN[1] | IN[2] | OUT[0] |
|---|---|---|---|
| 0 | 0 | 0 | TRUTH[0] |
| 0 | 0 | 1 | TRUTH[1] |
| 0 | 1 | 0 | TRUTH[2] |
| 0 | 1 | 1 | TRUTH[3] |
| 1 | 0 | 0 | TRUTH[4] |
| 1 | 0 | 1 | TRUTH[5] |
| 1 | 1 | 0 | TRUTH[6] |
| 1 | 1 | 1 | TRUTH[7] |

PROGRAMMABLE LOGIC UNIT

CROSS REFERENCE TO RELATED APPLICATION

This patent document is a continuation of and claims the benefit of the priority of U.S. patent application Ser. No. 13/858,757, filed Apr. 8, 2013, which is a continuation of U.S. patent application Ser. No. 13/304,287, filed Nov. 23, 2011 (now U.S. Pat. No. 8,415,975), which is incorporated herein by reference in its entirety.

TECHNICAL FIELD

This patent document relates to programmable logic.

BACKGROUND

Logic devices can be classified into two broad categories—fixed and programmable. As the name suggests, the circuits in a fixed logic device are permanent, they perform one function or set of functions—once manufactured, they cannot be changed. Programmable logic can be divided into several groups: randomly addressable memories, array logic, complex programmable logic devices (CPLDs), and field-programmable gate arrays (FPGAs). Various examples of randomly addressable memories include programmable read-only memory (PROM), erasable programmable read only memory (EPROM), electrically erasable programmable read-only memory (EEPROM), random access memory (RAM). Various examples of array logic include programmable logic devices (PLDs), programmable array logic (PAL), generic array logic (GAL), programmable macro logic (PML), programmable logic module (PLM), field programmable logic array (FPLA), erasable programmable logic device (EPLD), and multiple array PLD.

SUMMARY

This document describes, among other things, technologies relating to programmable logic. In one aspect, programmable logic units can include one or more input interfaces to receive one or more input signals; first logic elements that are individually programmable to be one of a truth table, data register, and a buffer register; second logic elements that are programmable decoders; third logic elements that are individually programmable to be one of a counter, delay element, and a filter; one or more output interfaces to provide one or more output signals; and a programmable interconnect array that selectively forms one or more interconnections within a group including the one or more input interfaces, the one or more output interfaces, and the logic elements. The programmable interconnect array can be programmable in routing the one or more input signals to at least a portion of the logic elements, is programmable in routing one or more intermediate signals among at least a portion of the logic elements, and is programmable in routing one or more signals from at least a portion of the logic elements to produce the one or more output signals via the output interface.

These and other implementations can include one or more of the following features. The one or more input signals can include two or more clock signals. The programmable interconnect array can include a clock selector that is programmable in a selection of the two or more clock signals. The programmable interconnect array can be programmed to distribute a selected clock signal to at least one of the logic elements. The programmable interconnect array can be programmable to communicatively couple a second logic element of the one or more second logic elements with a first logic element of the one or more first logic elements. The second logic element can decode an input provided by the programmable interconnect array using a value stored in the first logic element to produce a decoded output signal as one of the one or more output signals. The decoded output signal can include a serial bit-stream. The second logic element can encode an input provided by the programmable interconnect array using a value stored in the first logic element to produce an encoded output signal as one of the one or more output signals.

In another aspect, systems can include a processor unit configured to perform operations and a programmable logic unit that is communicatively coupled with the processor unit. Implementations can include a peripheral that is communicatively coupled with the programmable logic unit. An integrated circuit can include the processor unit, the programmable logic unit, and the peripheral. The processor unit can be configured to program the programmable logic unit to receive at least one of the one or more input signals from the peripheral, provide at least one of the one or more output signal to the peripheral, or both. In some implementations, an integrated circuit package includes the processor unit, the programmable logic unit, and the electrical contacts. The processor unit can be configured to program the programmable logic unit to receive at least one of the one or more input signals from at least a portion of the electrical contacts, provide at least one of the one or more output signal to at least a portion of the electrical contacts, or both.

In yet another aspect, a programmable logic unit can include one or more first logic elements that are individually programmable to be one of a plurality of first functions; one or more second logic elements that are a decoder; one or more third logic elements that are individually programmable to be one of a plurality of second functions; one or more output interfaces to provide one or more output signals; and a programmable interconnect array that selectively forms one or more interconnections within a group including the one or more input interfaces, the one or more output interfaces, and the logic elements. The programmable interconnect array is programmable in routing the one or more input signals to at least a portion of the logic elements, is programmable in routing one or more intermediate signals among at least a portion of the logic elements, and is programmable in routing one or more signals from at least a portion of the logic elements to produce the one or more output signals via the output interface.

These and other implementations can include one or more of the following features. The one or more input signals can include data from one or more direct memory access operations, where the data are stored in one or more of the one or more first logic elements. The programmable interconnect array can be programmable to communicatively couple a second logic element of the one or more second logic elements with a first logic element of the one or more first logic elements. In some implementations, the second logic element decodes an input provided by the programmable interconnect array using a value stored in the first logic element to produce a decoded output signal as one of the one or more output signals. The decoded output signal can include a serial bit-stream. The second logic element encodes an input provided by the programmable interconnect array using a value stored in the first logic element to produce an encoded output signal as one of the one or more output signals. In some implementations, the plurality of first functions and the plurality of second functions are different by at least one function. The first functions can include a truth table, data register, and a buffer register. The second functions can include a counter, delay element, and a filter. The one or more input signals can include data from one or more direct memory access operations.

Particular embodiments of the technology described in this document can be implemented so as to realize one or more of the following advantages. One or more described technologies can reduce the overall bill of material (BOM) of a product, decreased power consumption, or both. One or more described technologies can provide on-the-fly reconfiguration, flexible encoding/decoding capabilities, flexible data length configurations for serial data transfers, or a combination thereof. One or more described technologies can provide high speed logic (e.g., logic circuitry operating at 60 or 70 MHz which has been fabricated under a 0.35 μm process) that is fully programmable, whereas a FPGA may have difficulties operating at high speeds.

The details of one or more embodiments of the subject matter described in this document are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
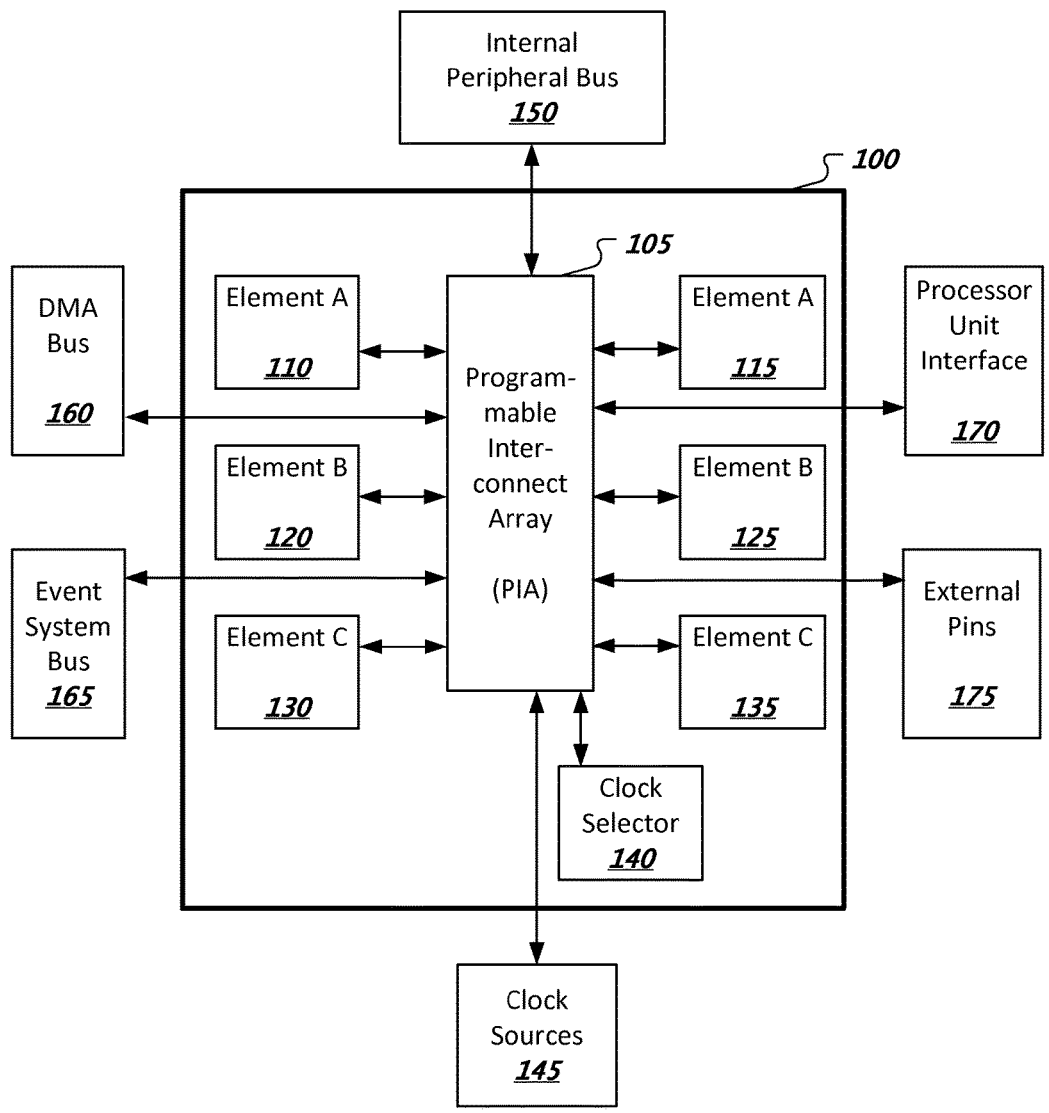
FIG. 1 shows an example of a programmable logic unit (PLU) architecture.

Despite their broad benefits, existing programmable logic circuitry can be unnecessarily generic or unnecessarily complex for certain classes of applications. Consequently, if used for such applications, a significant portion of their circuitry can be underutilized. Underutilized circuitry can increase power consumption and waste valuable space on an integrated circuit. Yet, such applications benefit from the flexibility of programmable logic circuitry. This patent document describes, among other things, an architecture for a programmable logic unit (PLU). A described PLU can provide the flexibility of programmable logic circuitry and reduce or eliminate underutilized circuitry for a broad range of applications.

Systems can perform various types of activities. For a system that requires serial communication, there is a need to have a specific type of encoding for transmitting a frame. A possible approach is to implement in non-reconfigurable hardware a specific coding style such as Manchester encoding. In this case, such hardware cannot be altered to support a different type of coding style such as non-return-to-zero (NRZ). Thus, such hardware doesn't provide flexibility and may have a high cost of material due to the hardware's customization. Another possible approach is to implement the coding style in a software program running on a processor unit. The drawback is power consumption, since the processor unit has to be in an active mode to perform the coding style. Several milliamps can be consumed just for this task, before the processor unit is able to return to an idle state. Another problem is the usage and cost of external components. An example is keyboard signal processing. When a computer is locked, the computer has to detect a simultaneous key press "CTRL+ALT+DEL." Basically, such a detection can be thought of as an output of a 3-input AND gate. Existing approaches include (1) using an external AND gate component or (2) using a general purpose input output (GPIO) to receive keyboard signal and a software program (such as a low-level routine) to process the received keyboard signals. Here, power consumption is increased, or external components have to be used, which increases the circuit area, signal routing requirements, and cost. Another example addresses applications with "repetitive" tasks. The analog-digital-convertor (ADC) scan mode is such an example. Ideally, the processor unit must be running when a full scan is completed (e.g., after eight conversions). Typically, there is a need to have a counter which generates an interrupt when the scan is completed. Some devices can (1) use a specific counter for this specific need, (2) use an existing system timer, or (3) leave the processor unit in the active state. The drawbacks here may include (1) using non-reconfigurable hardware that doesn't provide flexibly, (2) using only a portion of an existing resource (e.g., using an 8-bit count when a 3-bit counter is sufficient, (3) wasting power while the processor unit is in the active state, which has great consequences for systems running on battery power, or a combination thereof. An alternative is to use a PLU as described herein. In some cases, a PLU is used to off-load a task, or a portion thereof, from the processor unit. For example, a PLU can be programmed to detect the "CTRL+ALT+DEL" key sequence and send a wake-up interrupt to cause a processor unit to return to an active state.

A PLU, in general, can be programmed to perform a variety of functions. These functions can be performed by logic elements that are included in the PLU. In some implementations, a PLU includes logic elements of different types. For example, a PLU can include logic elements of a first type that are each individually programmable to be one of a first set of functions and logic elements of a second type that are each individually programmable to be one of a second set of functions; the first and second sets of functions can be mutually exclusive or can have one or more functions in common. A programmable interconnect array (PIA), included in a PLU, can be programmed to distribute one or more input signals to selected ones of the logic elements, distribute intermediate signals among the logic elements, and collect an output signal from a logic element and provide it as an output of the PLU.

Systems and devices (e.g., computer system, microcontroller, or system-on-a-chip) can include one or more PLUs. PLUs can be programmed for a wide range of applications. Various examples of applications suited for a PLU include controlling data transmission via a serial bit-stream, inverting data such as inverting data from a receive pin (RxD) or data to a transmit pin (TxD) pin on a universal synchronous/asynchronous receiver/transmitter (USART) bus, performing Manchester encoding/decoding using the USART, inserting dead time between power width modulation (PWM) pulses, or triggering an action only when a pre-determined number of events have been received or when a pre-determined number of pin levels are present at the same time. One or more described PLU can be implemented as high speed logic (e.g., logic circuitry operating at 60 or 70 MHz which has been fabricated under a 0.35 μm process).

FIG. 1 shows an example of a programmable logic unit architecture. A PLU 100 includes a first logic element A 110, a second logic element A 115, a first logic element B 120, a second logic element B 125, a first logic element C 130, and a second logic element C 135. These logic elements are interconnected via a PIA 105. The PIA 105 further is connectable to a clock selector 140, clock sources 145, internal peripheral bus 150, a direct memory access (DMA) bus 160, event system bus 165, processor unit interface 170, and external pin(s) 175.

Based on a programming operation, the PIA 105 selectively forms one or more interconnections within a group including the one or more input interfaces, the one or more output interfaces, and the logic elements 110, 115, 120, 125, 130, 135. In some implementations, the PIA 105 includes the clock selector 140. The one or more input interfaces can receive input signals from the clock selector 140, clock sources 145, internal peripheral bus 150, a DMA bus 160, event system bus 165, processor unit interface 170, external pin(s) 175, or a combination thereof. The one or more output interfaces can provide an output signal(s) to one or more destinations such as an internal peripheral bus 150, a DMA bus 160, event system bus 165, processor unit interface 170, or external pin(s) 175. In some implementations, the PIA 105 includes a network of multiplexers and demultiplexers. In some implementations, the PIA 105 includes a programmable switching fabric.

In some implementations, the first logic element A 110 and the second logic element A 115 can be configured via a programming operation as a truth table, data register, or a buffer register. In some implementations, the first logic element A 110 and the second logic element A 115 include an 8-bit register. Other register bit sizes are possible, such as 16-bit or 32-bit. The first logic element B 120 and the second logic element B 125 can include a 4-bit decoder. Other decoder bit sizes are possible, such as 8-bit, 16-bit, or 32-bit. The first logic element C 130 and the second logic element C 135 can be configured via a programming operation as a counter, delay element, or a filter. In some implementations, the first logic element C 130 and the second logic element C 135 include a 4-bit register. Other register bit sizes are possible, such as 8-bit, 16-bit, or 32-bit.

The internal peripheral bus 150 can connect the PLU 100 with one or more peripherals, e.g., a module that has a specific function. Various examples of peripherals include a timer, universal synchronous/asynchronous receiver/transmitter (USART), and a serial peripheral interface (SPI). In some implementations, the PLU 100 is considered to be a peripheral. The event system bus 165 allows direct inter-peripheral communication and signaling. The event system bus 165 receives events from a peripheral and routes them to another peripheral. The DMA bus 160 can be used to transfer data between a memory (not shown) and the PLU 100 without directly involving a processor unit. In some implementations, DMA bus 160 is used to transfer data from one peripheral to another peripheral. The clock selector 140 can cause a selection of two or more clock sources 145 for one or more sequential logic operations performed by the PLU 100.

Programming the PLU 100 can include sending programming commands from a processor unit to the PLU 100 via the processor unit interface 170. In some implementations, the PLU 100 stores programming settings in a memory such as a non-volatile memory or a volatile memory. In some implementations, a processor unit can dynamically reprogram the PLU 100 without requiring a power-cycle. In some implementations, components such as the PLU 100 and a processor unit compose a System-on-a-Chip (SoC). The SoC can be formed as an integrated circuit that is included in an integrated circuit package. The integrated circuit package can include electrical contacts, such as external contact pads or external pins, for external electrical connectivity.

Figure 2A:
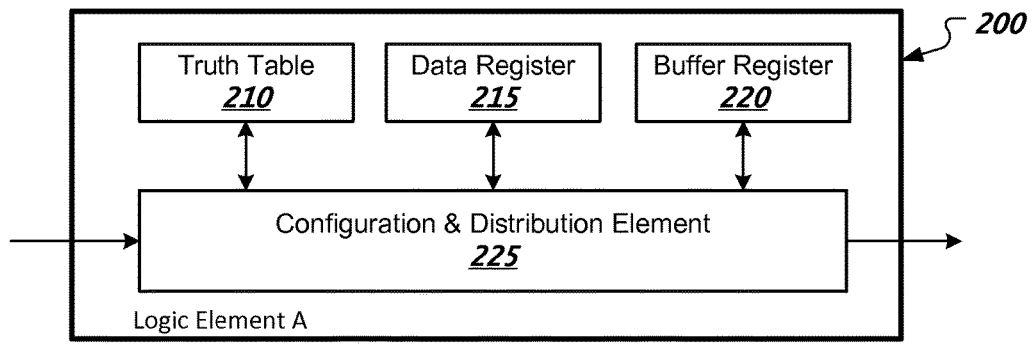
FIGS. 2A, 2B, and 2C show different examples of different types of logic elements.

FIG. 2A shows an example of a logic element of a first type. In this example, a logic element A 200 includes a truth table 210, data register 215, buffer register 220, and configuration & distribution logic 225. The configuration & distribution element 225 can distribute an input signal to one of the truth table 210, data register 215, and buffer register 220. The configuration & distribution element 225 can collect an output signal from one of the truth table 210, data register 215, and buffer register 220. The configuration & distribution element 225 can provide the collected signal to a programmable interconnect array. In some implementations, the truth table 210, the data register 215, and the buffer register 220 are replaced by a single memory structure. In some implementations, a truth table 210 is used as a look-up table (LUT) for a decoder. Signal routing within the configuration & distribution element 225 can be controlled via a configuration input signal.

Figure 2B:
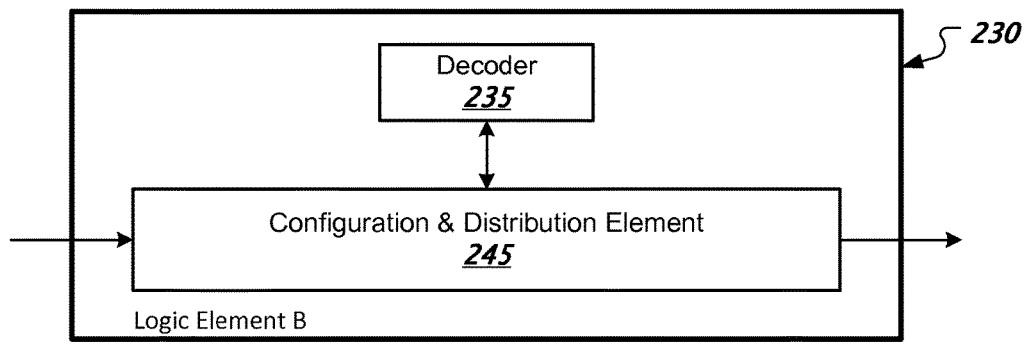

FIG. 2B shows an example of a logic element of a second type. A logic element B 230 includes a decoder 235, and a configuration & distribution element 245. The configuration & distribution element 225 can send signals to and receive signals from the decoder 235. The decoder 235 can be programmed to be an encoder. In some cases, a decoder performs the same function as an encoder (e.g., for the same inputs, both the encoder and decoder produces the same output).

Figure 2C:
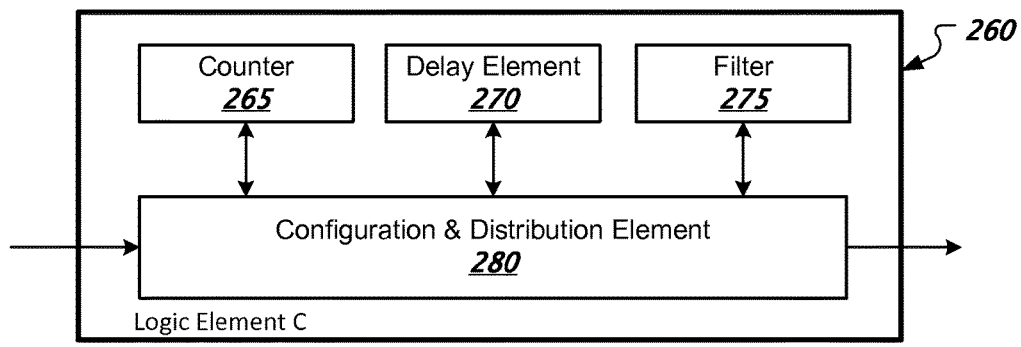

FIG. 2C shows an example of a logic element of a third type. A logic element C 260 includes a counter 265, delay element 270, filter 275, and configuration & distribution element 280. The configuration & distribution element 225 can distribute an input signal to one of the counter 265, delay element 270, and filter 275. The configuration & distribution element 225 can collect an output signal from one of the counter 265, delay element 270, and filter 275. The configuration & distribution element 225 can provide the collected signal to a programmable interconnect array.

Figures 3A, 3B:
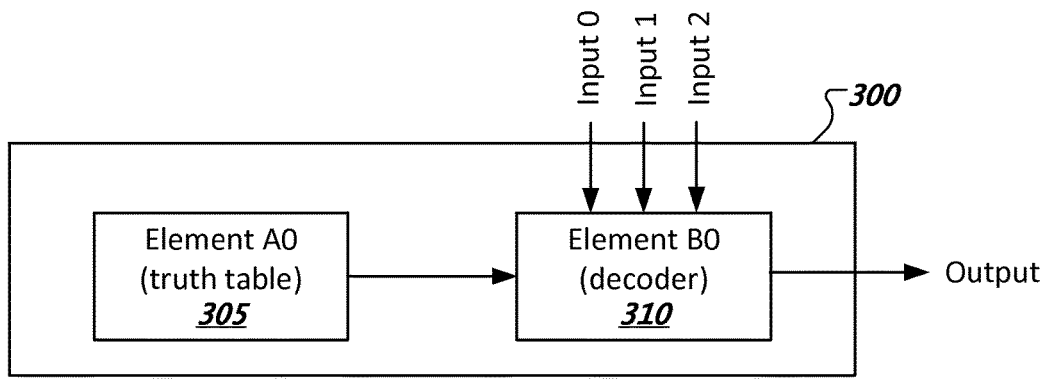
FIG. 3A shows an example of a PLU programmed to perform a logic operation.
FIG. 3B shows an example of a truth table.

FIG. 3A shows an example of a PLU programmed to perform a logic operation. A PLU 300 includes a logic element A0 305 programmed to be a truth table and a logic element B0 310 programmed to be a decoder. Based on three inputs to the logic element B0 310, the logic element B0 310 looks up the corresponding output value via the logic element A0 305. A PIA (not shown) included in the PLU 300 is programmed to provide the logical connections depicted by FIG. 3A, where the solid arrows denote a programmed logical connection via the PIA. In this example, the PIA has been programmed to route three input signals from three input interfaces into logic element B0 310. An input interface can include an electrical connection with an electrical contact, e.g., one or more external pins or contact pads, to receive a signal. Further, the PIA has been programmed to route one or more intermediate signals between logic element A0 305 and logic element B0 310. Further, the PIA has been programmed to route an output signal from logic element B0 310 to an output interface of the PLU 300. An output interface can include an electrical connection with an electrical contact, e.g., one or more external pins or contact pads, to provide a signal.

FIG. 3B shows an example of a truth table. In this example, a truth table 350 includes an output for each 3-bit input value. The 3-bit input value can include a first bit from input 0 of FIG. 3A, a second bit from input 1, and a third bit from input 2. The truth table 350 can be stored in a data structure include in the logic element A0 305. For 3-bit input values, there are a total of 8 different combinations of input values. The truth table 350 stores an output value for each possible input value. In some implementations, a logic element B0 310 can send an input value to logic element A0 305. Logic element A0 305 accesses the truth table 350 based on its received input, and sends a corresponding output value to logic element B0 310.

Figure 4:
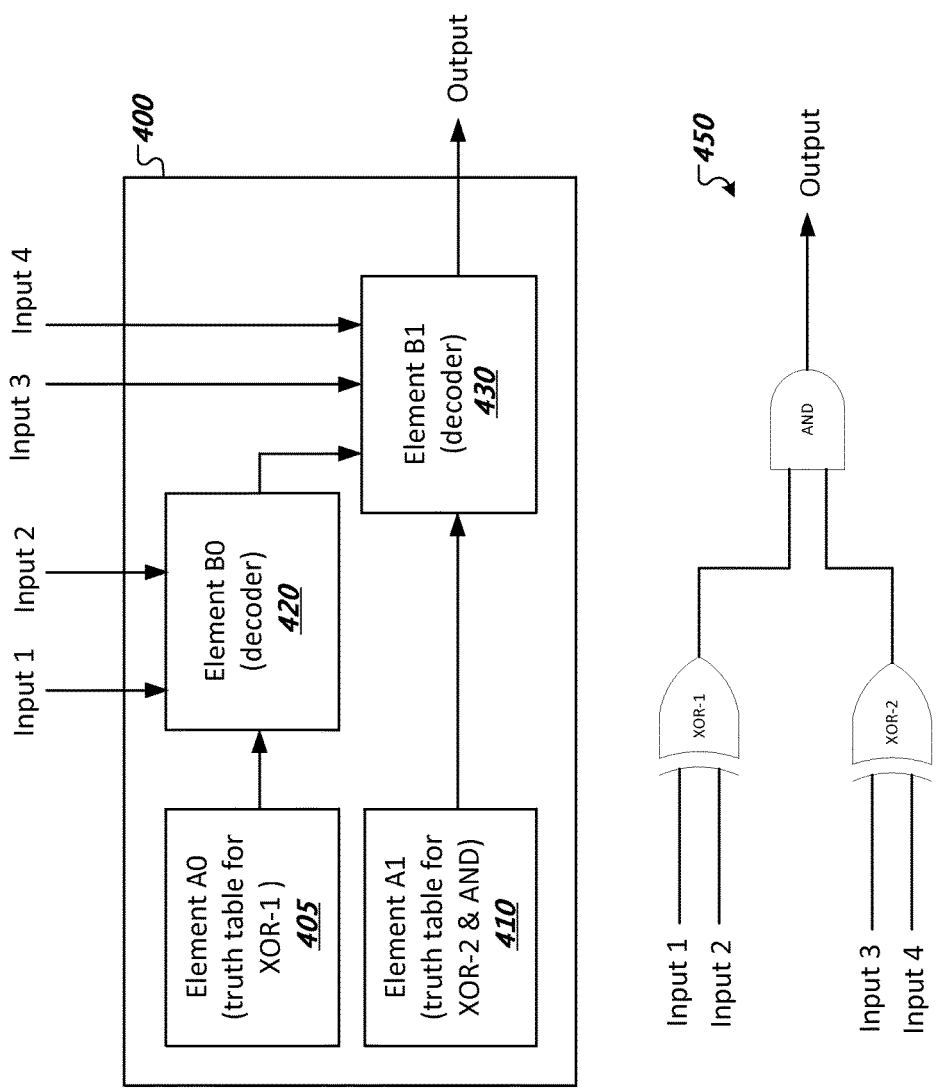
FIG. 4 shows another example of a PLU programmed to perform logical functions.

FIG. 4 shows another example of a PLU programmed to perform logical functions. In this example, a PLU 400 is programmed to perform logical functions as depicted by the circuit schematic 450 in the lower portion of FIG. 4. The PLU 400 includes a logic element A0 405 programmed to be a first truth table that implements XOR logic, logic element B0 420 programmed to be a decoder that uses the first truth table to perform a logic operation on its inputs (input 1 and input 2), logic element A1 410 programmed to be a second truth table that implements XOR and AND logic, and logic element B1 430 programmed to be a decoder that uses the second truth table to perform a logic operation on its inputs (input 3, input 4, and output from element B0 420). The output of the PLU 400 is equivalent to the output of the circuit schematic 450. A PIA (not shown) included in the PLU 400 is programmed to provide the logical connections depicted by FIG. 4, where the solid arrows denote a programmed logical connection via the PIA.

Figure 5:
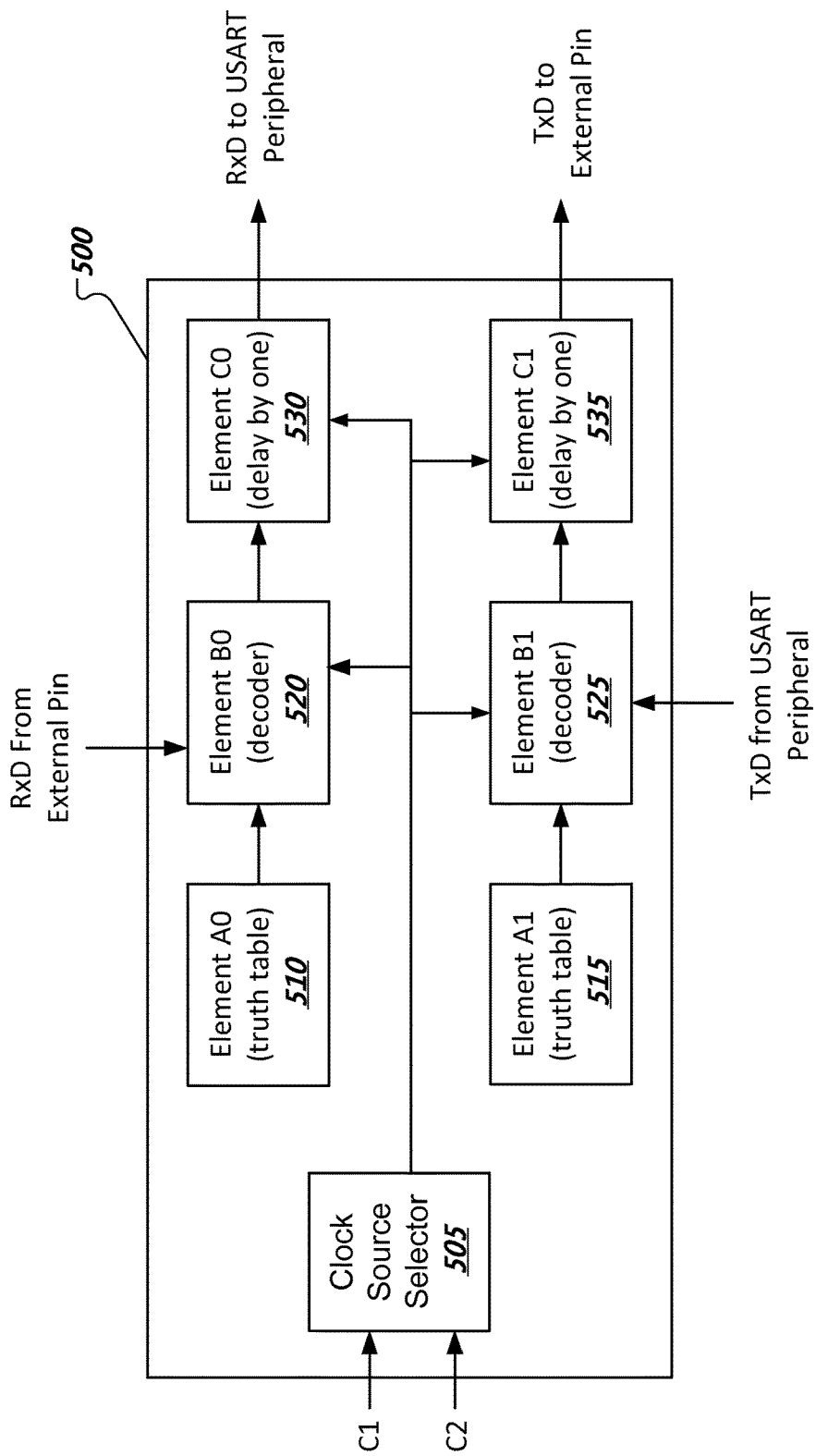
FIG. 5 shows an example of a PLU programmed to perform encoding and decoding for a universal synchronous/asynchronous receiver/transmitter (USART).

FIG. 5 shows an example of a PLU programmed to perform encoding and decoding for a USART. A PLU 500 can be programmed to be a Manchester encoder/decoder for a USART. Note that Manchester encoding is the same as Manchester decoding. Thus, given an input signal that is Manchester encoded, the PLU 500 produces a decoded output signal. Given an input signal that is not Manchester encoded, the PLU 500 produces a Manchester encoded output signal. Other types of encoding and decoding are possible such as non-return-to-zero (NRZ). The PLU 500 includes a logic element A0 510 programmed to be a truth table, a logic element A1 515 programmed to be a truth table, logic element B0 520 programmed to be a decoder, logic element B1 525 programmed to be a decoder, logic element C0 530 programmed to be a delay-by-one, and logic element C1 535 programmed to be a delay-by-one. A delay-by-one is used to output a received input one clock cycle later. A PIA (not shown) included in the PLU 500 is programmed to provide the logical connections depicted by FIG. 5, where the solid arrows denote a programmed logical connection via the PIA.

The truth table stored in element A0 510 is programmed to cause logic element B0 520 to perform a XOR logic function on its inputs (e.g., RxD from external pin and an output from the clock source selector 505). The truth table stored in element A1 515 is programmed to cause logic element B1 525 to perform a XOR logic function on its inputs (e.g., TxD from USART peripheral and an output from the clock source selector 505). Note that Manchester encoding and decoding operations are symmetric (encoding is an XOR of a clock signal and a data signal, and decoding is an XOR of an encoded data signal and a clock signal).

A clock source selector 505 of the PLU 500 can select a clock input from two or more sources (e.g., internal source C1 or external source C2) based on whether the PLU 500 is operating as a master or a slave. Operating as a master, the clock source selector 505 selects a clock source from an internal source C1 such as from an internal USART peripheral. Operating as a slave, the clock source selector 505 selects a clock source from an external source C2 such as an external pin.

Figure 6:
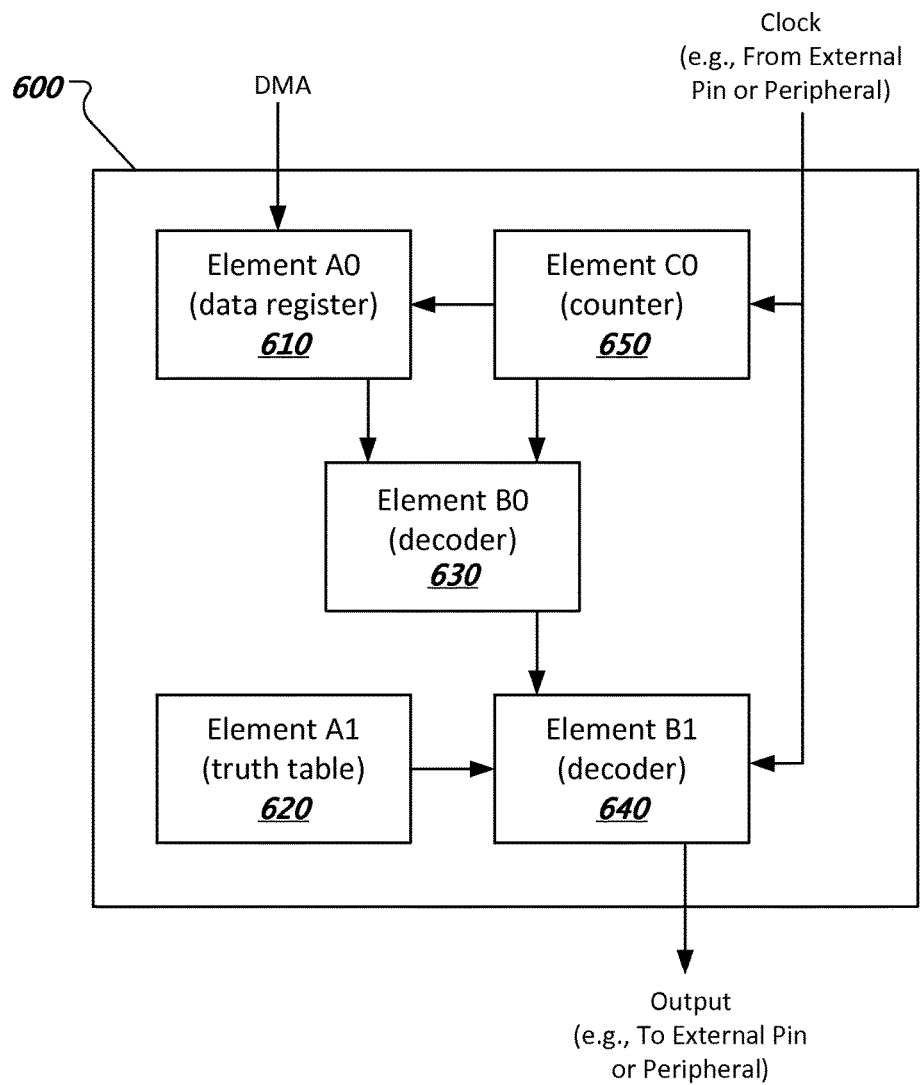
FIG. 6 shows an example of a PLU programmed for transferring and encoding data.

FIG. 6 shows an example of a PLU programmed for transferring and encoding data. A PLU 600 programmed for transferring and encoding data includes logic element A0 610 programmed to be a data register, logic element A1 620 programmed to be a truth table, logic element B0 630 programmed to be an encoder, logic element B1 640 programmed to be a decoder, and logic element C0 650 programmed to be a counter. A DMA operation can load a data register of logic element A0 610 with one or more values. The logic element B1 640 produces an output for the PLU 500. A clock signal can be applied to logic element C0 650 and logic element B1 640. A first section of the PLU 600 (including logic element A0 610, logic element B0 630, and logic element C0 650) is used to serialize data stored in the data register of logic element A0 610. Logic element B0 630 outputs a serial data stream to a second section of the PLU 600 (including logic element A1 620 and logic element B1 640) which is used to encode the serial data stream for transmission via an external pin or on-chip peripheral. A PIA (not shown) included in the PLU 600 is programmed to provide the logical connections depicted by FIG. 6, where the solid arrows denote a programmed logical connection via the PIA.

Figure 7:
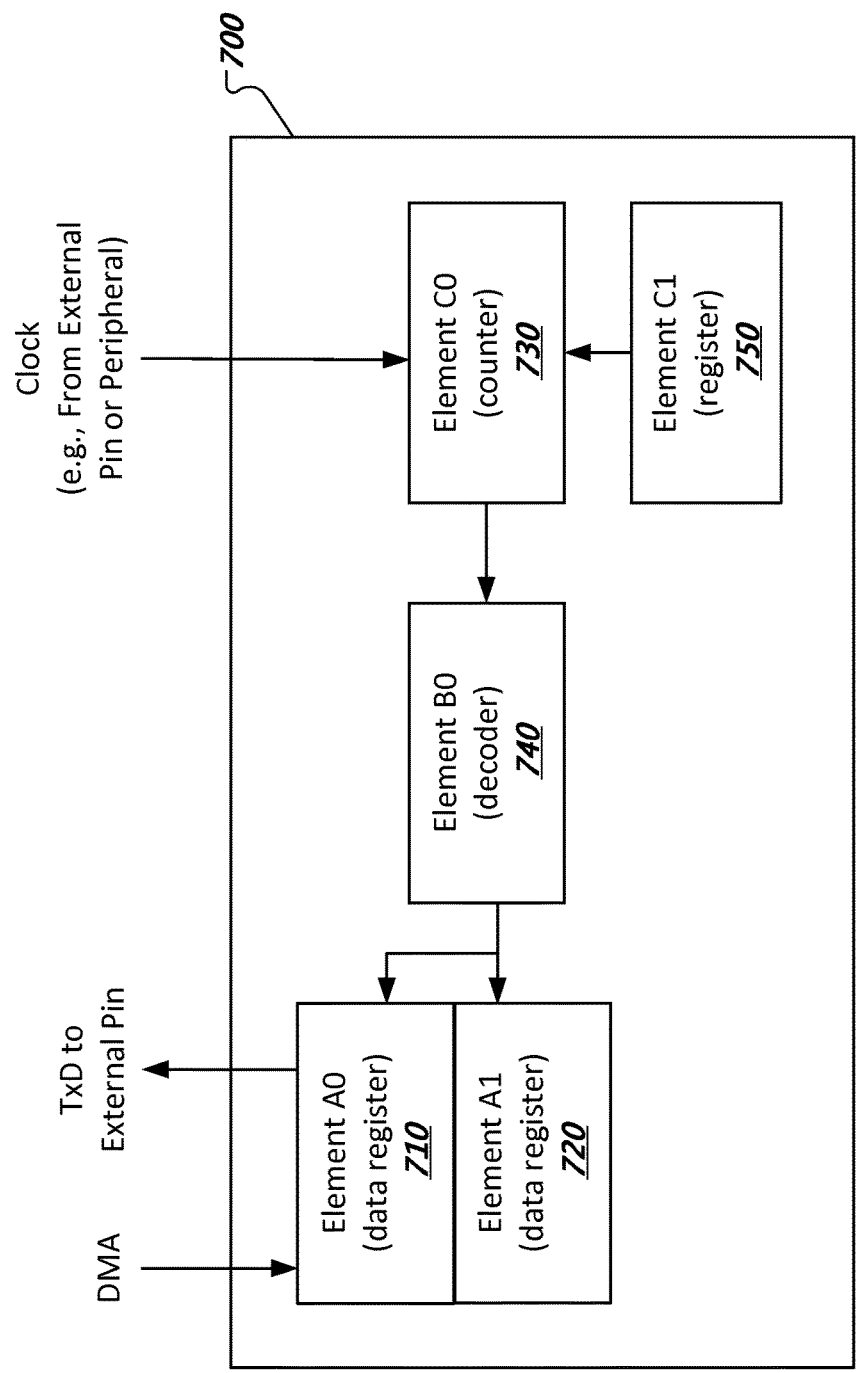
FIG. 7 shows an example of a PLU programmed to be a shift register for a serial communication protocol.

FIG. 7 shows an example of a PLU programmed to be a shift register for a serial communication protocol. A PLU 700 programmed to be a shift register for a serial communication protocol includes logic element A0 710 programmed to be a data register, logic element A1 720 programmed to be a data register, logic element B0 740 programmed to be a decoder, logic element C0 730 programmed to be a counter, and logic element C1 750 programmed to be a register. A PIA (not shown) included in the PLU 700 is programmed to provide the logical connections depicted by FIG. 7, where the solid arrows denote a programmed logical connection via the PIA. Element A0 710 and element A1 720 can be used to store data to be transmitted or data that was received (START/STOP bit included). The PLU 700 can support both most significant bit (MSB) and least significant bit (LSB) first formats.

The PLU 700, for example, can be programmed to transmit 8-bit USART data with the LSB first in a 10-bit USART frame. Data are transmitted between a START BIT (bit=0) of the frame and a STOP BIT (bit=1) of the frame. Supposing data to be transmitted is 0x53 (hex), which is 01010011 in binary code, the USART frame with LSB first looks like 0-11001010-1. Element A0 710 and element A1 720 are used to store the USART frame (xxxxxx10 10100110, where 'x' indicates a not-used bit-element of the register). Element C0 730 is set as an increment counter and initialized to 0. Element C1 750 is set as a register to hold a TOP value for the counter of element C0 730, where the TOP value is 10 since 10 bits are to be transmitted. The clock for the counter and decoder can be selectable via a clock selector that draws its inputs from an external pin (clock sent by a master) or internal peripheral (e.g., timer or event system). In this example, it is required that the clock period is a time bit period. At each clock cycle, the counter of element C0 720 is incremented by 1. The counter is used as a bit index into an array composed out of the bit elements of the data registers of both element A0 710 and element A1 720, and the corresponding bit is sent over the line. When the counter reaches the TOP, it is stopped (but not cleared, to maintain the STOP bit value).

Alternatively, the PLU 700 can be programmed to transmit 8-bit USART data with the MSB first. Supposing data to be transmitted is 0x53 (hex), which is 01010011 in binary code, the USART frame with MSB first looks like 0-01010011-1. Element A0 710 and element A1 720 are used to store the USART frame (xxxxxx00 10100111, where 'x' indicates a not-used bit-element of the register). Element C0 730 is set as a decrement counter and initialized to 10. At each clock cycle, the counter of logic element C0 730 is decremented by 1. As it is used as bit index for elements A0/A1, the corresponding bit is sent over the line. When the counter reaches the 0 value, the counter is stopped.

Figure 8:
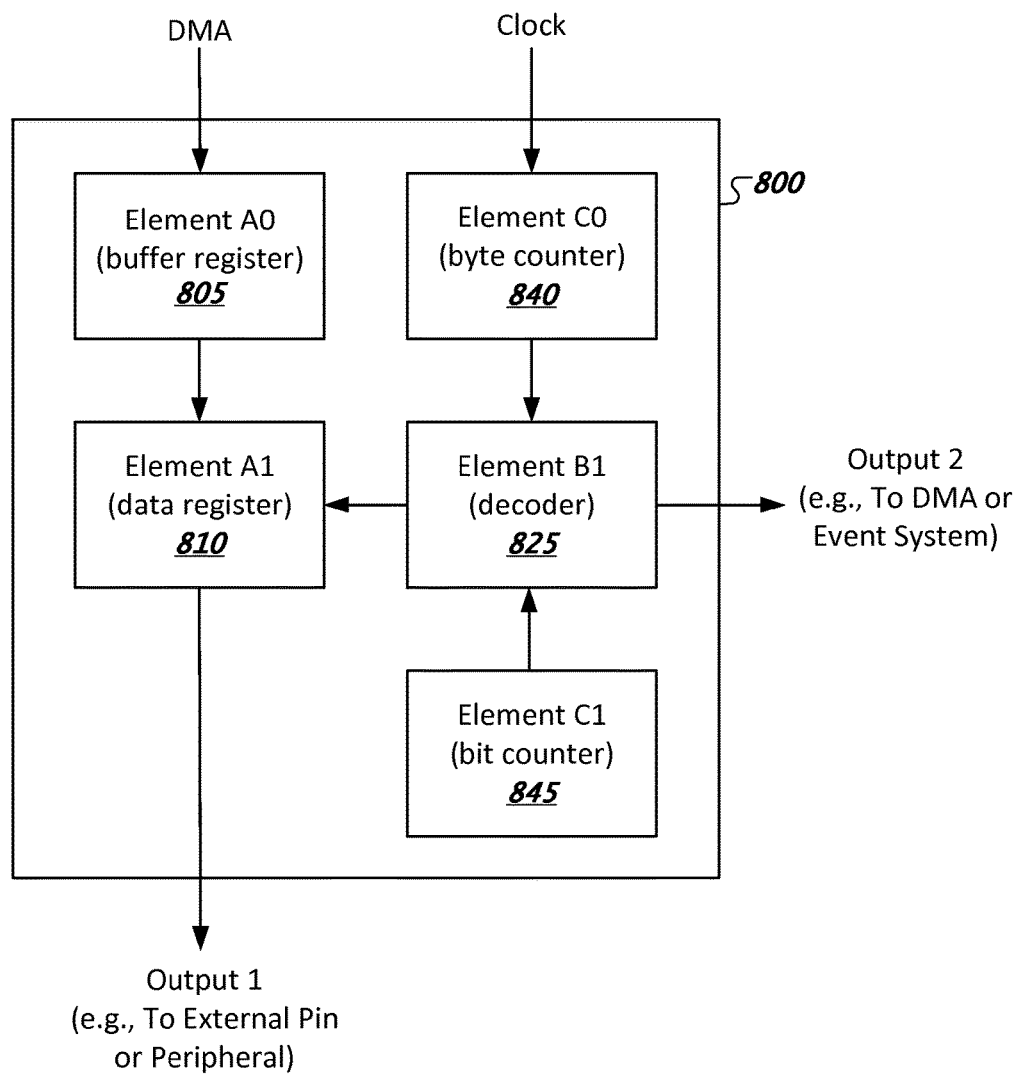
FIG. 8 shows an example of a PLU programmed for data buffer transmission.

FIG. 8 shows an example of a PLU programmed for data buffer transmission. A PLU 800 programmed for data buffer transmission includes logic element A0 805 programmed to be a buffer register, logic element A1 810 programmed to be a data register, logic element B1 825 programmed to be a decoder, logic element C0 840 programmed to be a byte counter, and logic element C1 845 programmed to be a bit counter. A PIA (not shown) included in the PLU 800 is programmed to provide the logical connections depicted by FIG. 8, where the solid arrows denote a programmed logical connection via the PIA. Logic element C0 840 is used in this example to define the number of bytes to be sent (full or partial bytes). An output of logic element C0 840 causes logic element B1 825 to output signals to trigger DMA transfers between a memory location and buffer register. Here, logic element A0 805, acting as a buffer register, is used to store a byte received from the DMA. Based on the buffer register receiving the byte, the received byte is transferred to the data register of logic element A1 810. Using an output of the decoder of logic element B1 825, logic element A1 810 provides a serial bit stream to an external pin. In some implementations, the PLU 800 is included in a SoC, and the logic element A1 810 provides a serial bit stream to an on-chip peripheral of the SoC. With logic element C1 845 being programmed to be a bit-counter, the bit-counter's TOP value is 8 while the byte-counter of logic element C0 840 has not reached its TOP value, else, the bit-counter's TOP value is the number of bits to be transmitted during the last transfer.

In a USART example, where 10 bits have to be transferred, two bytes DMA transfers have to be performed between a memory location and the PLU 800. In this case, the byte-counter of logic element C0 840 is set to 2, where a 0 value means no more DMA transfers or no transmissions. To transmit a 10-bit frame, the PLU 800 has to do one complete byte transfer (8 bits) and one partial byte transfer (2 bits). A TOP value for the bit-counter of logic element C1 845 is set to 8 for the first phase and then to 2 for the second phase. During the first phase, the bit-counter increments 8 times. During the second phase, the bit-counter resets to 0 and increments 2 times.

Figure 9A:
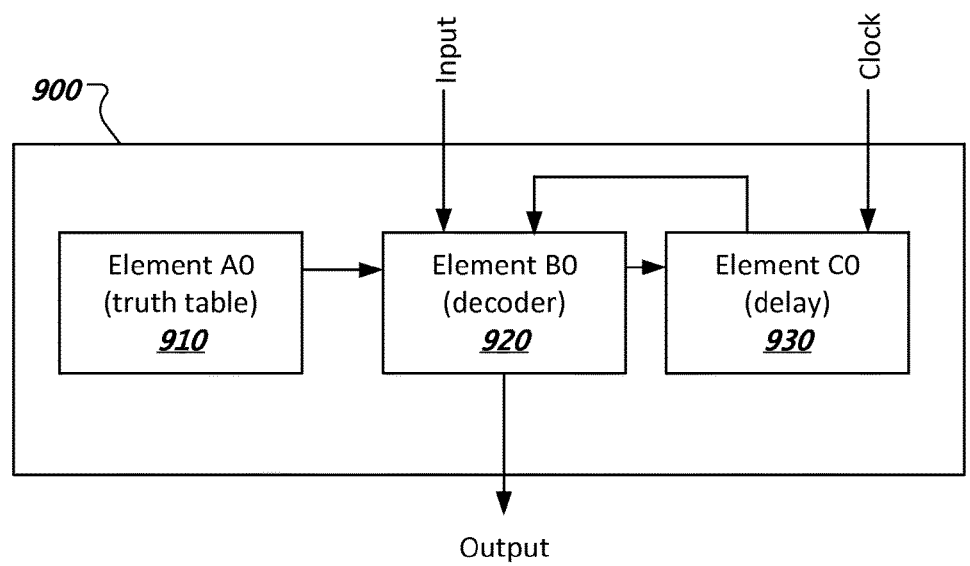
FIG. 9A shows an example of a PLU programmed to be an edge detector.

FIG. 9A shows an example of a PLU programmed to be an edge detector. A PLU 900 programmed to be an edge detector includes logic element A0 910 programmed to be a truth table, logic element B0 920 programmed to be a decoder, and logic element C0 930 programmed to be a delay. A PIA (not shown) included in the PLU 900 is programmed to provide the logical connections depicted by FIG. 9A, where the solid arrows denote a programmed logical connection via the PIA. To detect an edge on an input signal, the signal is sampled one time (delayed) and gate logics are used to generate an output pulse. The logic element B0 920 receives the input signal and a delayed version of the input signal via logic element C0 930. Using the truth table and its inputs, logic element B0 920 produces an output. The truth table can be programmed to cause a pulse on a falling edge, a pulse on a rising edge, or both. In some implementations, using clock options and timers allows the PLU 900 to generate pulses, which can be used for communication-based applications. In some implementations, using clock options and timers allows the PLU 900 to insert dead time periods on PWM signals, which can be useful for motor control applications.

Figure 9B:
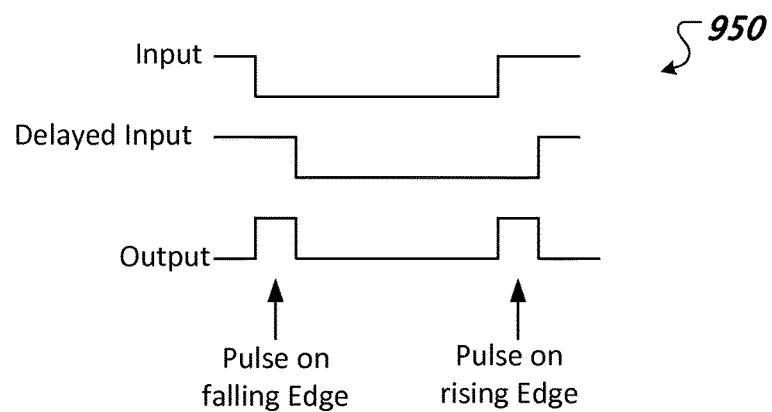
FIG. 9B shows example signal graphs associated with the PLU of FIG. 9A.

FIG. 9B shows example signal graphs associated with the PLU of FIG. 9A. The graphs 950 show an input signal, a delayed input signal that is produced by element C0 930, and an output signal that is produced by logic element B0 920. The output includes a pulse on a falling edge and a subsequent pulse on the rising edge.

Figure 10A:
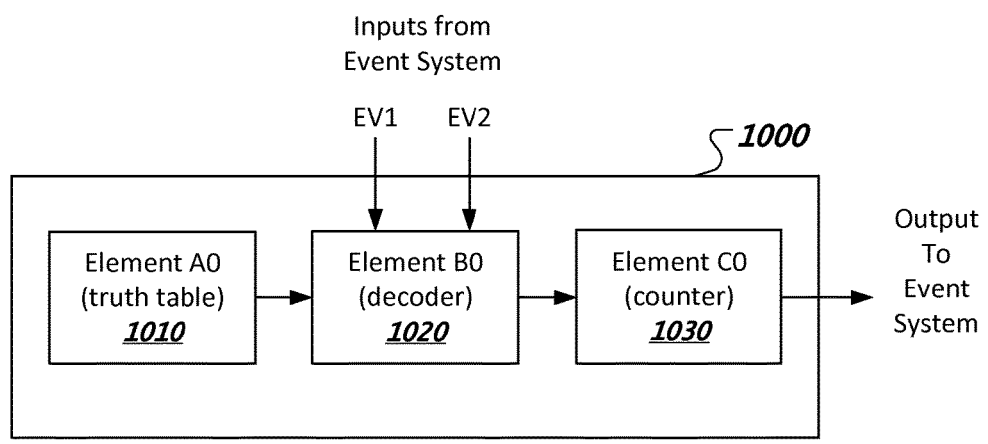
FIG. 10A shows an example of a PLU programmed to be an event counter.

FIG. 10A shows an example of a PLU programmed to be an event counter. A PLU 1000 programmed to be an event counter includes logic element A0 1010 programmed to be a truth table, logic element B0 1020 programmed to be a decoder, and logic element C0 1030 programmed to be a counter (which receives inputs from an event system). A PIA (not shown) included in the PLU 1000 is programmed to provide the logical connections depicted by FIG. 10A, where the solid arrows denote a programmed logical connection via the PIA. Logic element B0 1020 receives inputs from an event system (e.g., EV1 and EV2) and an output of the logic element A0 1010. In this example, the truth table of logic element A0 1010 causes logic element B0 1020 to be OR logic. Hence, either a pulse on EV1 or EV2 causes logic element B0 1020 to output a pulse to the counter of logic element C0. Logic element C0 1030 receives an input from logic element B0 1020 and provides an output to the event system. For example, when the counter reaches a pre-determined TOP value, logic element B0 1020 asserts a pulse to the event system.

Figure 10B:
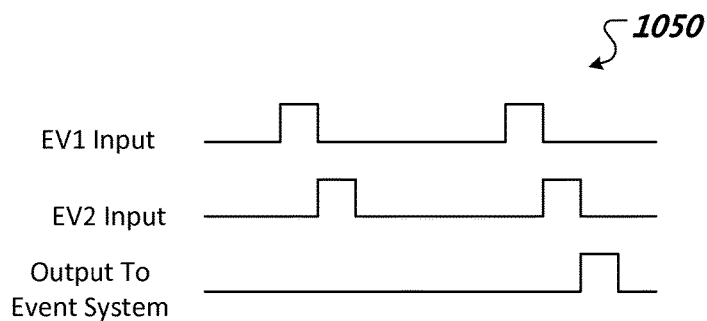
FIG. 10B shows example signal graphs associated with the PLU of FIG. 10A.

FIG. 10B shows example signal graphs associated with the PLU of FIG. 10A. In some applications, the system does not need to wake-up on each event. A typical example is the ADC scan mode, where an ADC performs conversions using one or more channels. The DMA can be used to transfer converted data to one or more memory locations, but the system is required to be informed when the ADC scan is completed. In this example, the system is required to be informed when 4 events are received. Programmed to be an event counter, the PLU 1000 can signalize the scan completion to the event system. The graphs 1050 show a first input signal (EV1) from the event system, a second input signal (EV2) from the event system, and an output to the event system that is produced by the logic element C0 1030. After the fourth event, logic element C0 1030 asserts a signal on the event system and then resets the counter back to zero.

Figure 11:
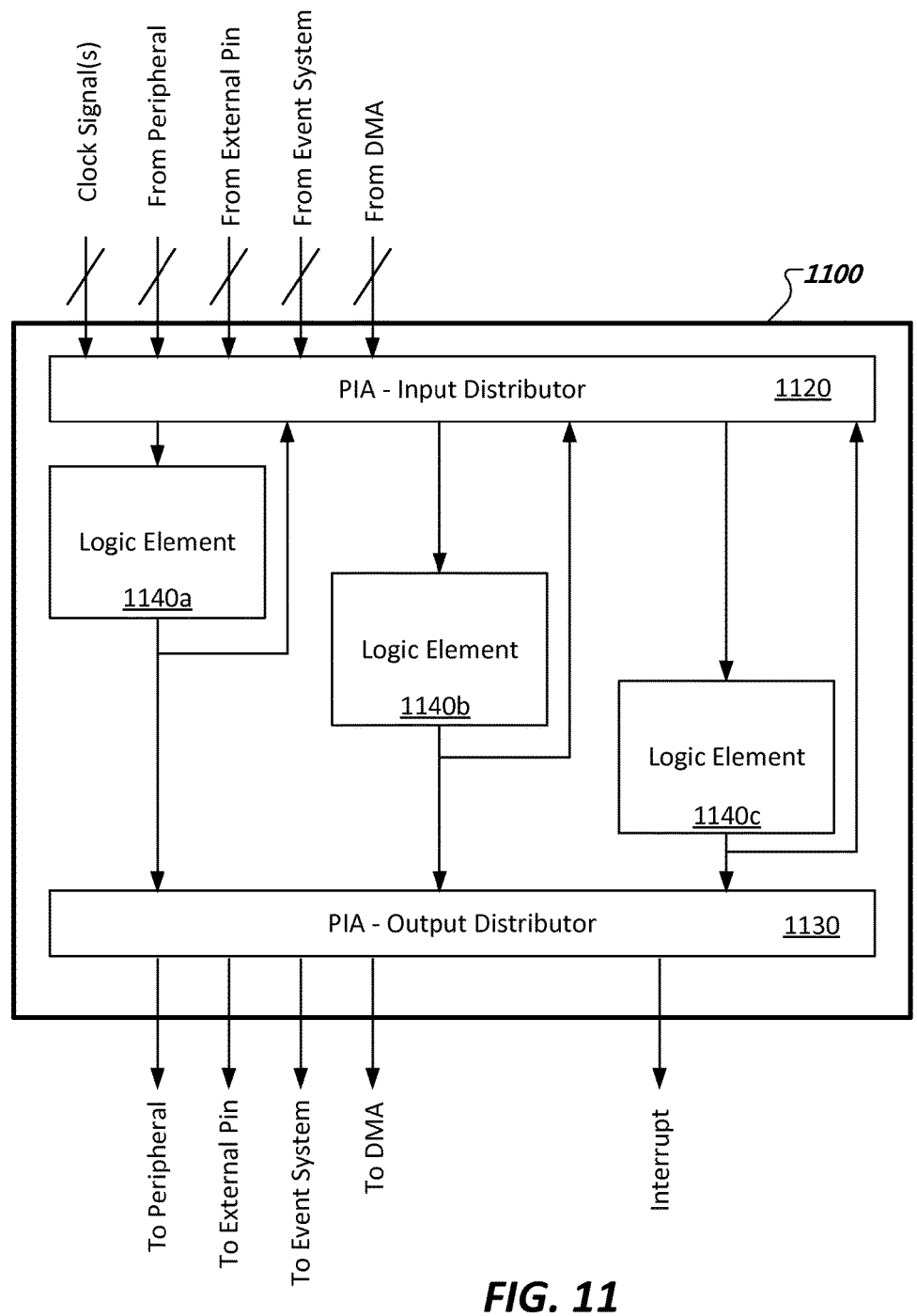
FIG. 11 shows another example of a PLU architecture.

FIG. 11 shows another example of a PLU architecture. A PLU 1100 can include a PIA that is split into an input distributor 1120 and an output distributor 1130. The input distributor 1120 can route signals from outside the PLU 1100 (e.g., one more clock signals, peripheral input, external pin input, event system, or DMA) to logic elements 1140*a*, 1140*b*, and 1140*c* inside of the PLU 1100. One or more clock signals can be provided to one or more logic elements 1140*a-c* for a sequential logic operation(s). Moreover, the output(s) of one or more logic elements 1140*a-c* can be turned into one or more inputs. Thus, the input distributor 1120 can route a logic element output(s) to a logic element input(s). The output distributor 1130 can route signals from one or more of the logic elements 1140*a-c* to one or more destinations such as a peripheral, external pin, event system, DMA, or interrupt.

Figure 12:
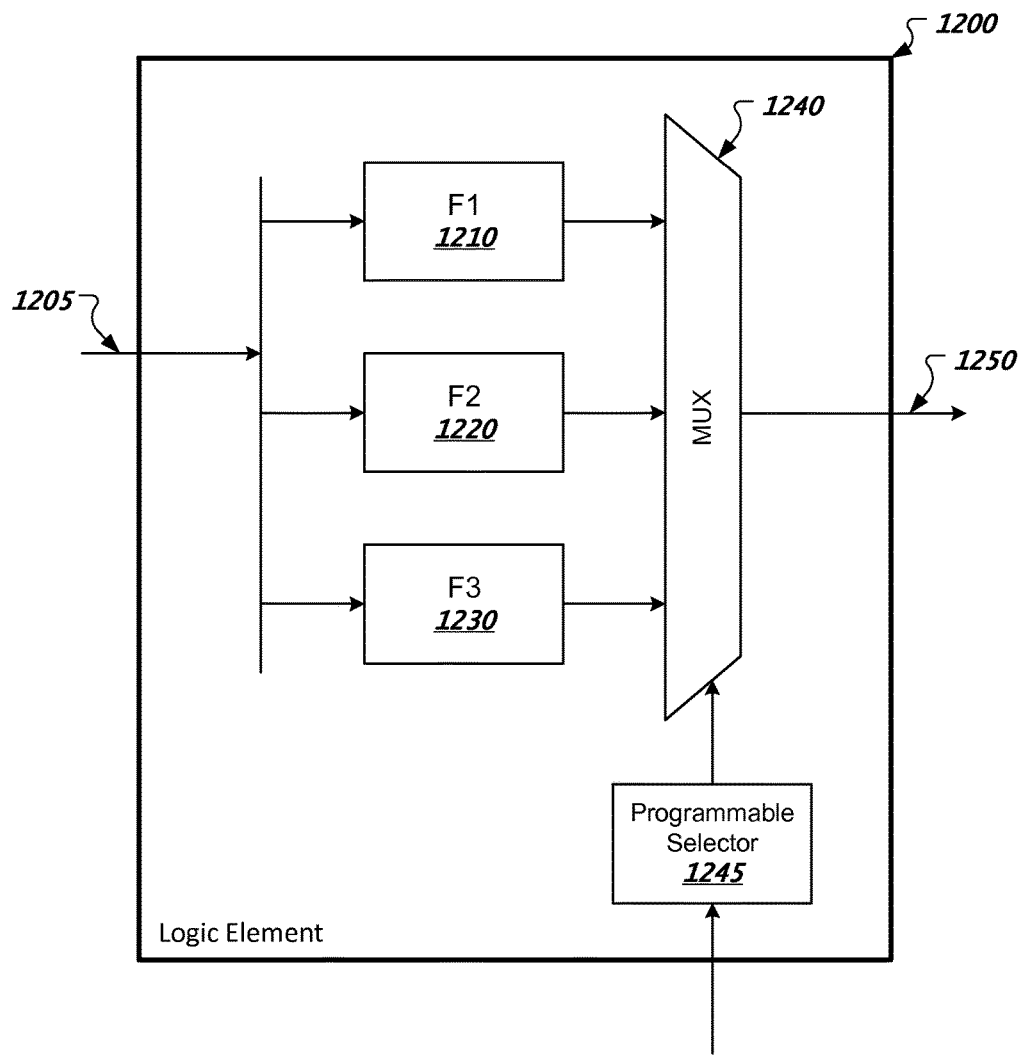
FIG. 12 shows an example of a logic element architecture.

FIG. 12 shows an example of a logic element architecture. A controller can configure a logic element 1200 to be one of three different types functions (F1, F2, or F3) via a programmable selector 1245 included in the logic element 1200. Other quantities of functions are possible. The logic element 1200 provides an input 1205 to multiple logic circuits such as logic circuit F1 1210, logic circuit F2 1220, and logic circuit F3 1230 that implement respectively the different types of functions supported by the logic element 1200. The outputs of the logic circuits 1210, 1220, 1230 are provided to a multiplexer 1240. Based on an output of the programmable selector 1245, the multiplexer 1240 selects one of its inputs and provides the selected input as an output 1250 for the logic element 1200.

Figure 13:
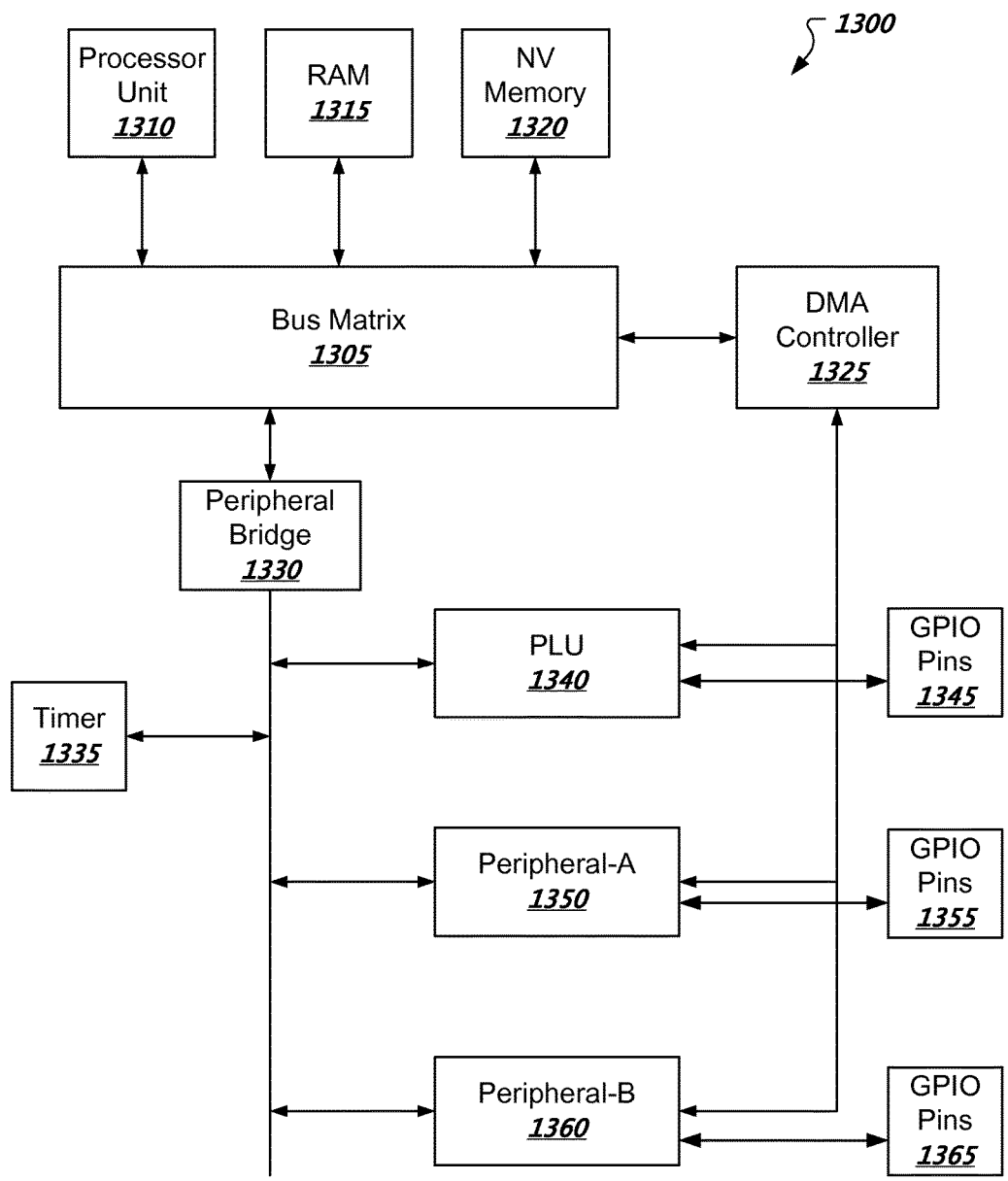
FIG. 13 shows an example of a system on a chip architecture that includes a PLU.

FIG. 13 shows an example of a system on a chip architecture that includes a PLU. A system on a chip (SoC) 1300 can include a bus matrix 1305, processor unit 1310, RAM 1315, non-volatile (NV) memory 1320, DMA controller 1325, and peripheral bridge 1330. The bus matrix 1305 routes signals among its connected components such as the processor unit 1310, RAM 1315, NV memory 1320, DMA controller 1325, and peripheral bridge 1330. The processor unit 1310 can include one or more processors. The peripheral bridge 1330 is connected with a timer 1335, a PLU 1340, peripheral-A 1350, and peripheral-B 1360. The DMA controller 1325 controls memory operations between peripheral components (e.g., PLU 1340, peripheral-A 1350, and peripheral-B 1360) and memory components such as the RAM 1315, off-chip memory (if available), or both. In some implementations, the processor unit 1310 is configured to program the PLU 1340 to receive at least one of the one or more input signals from a peripheral 1350, 1360. In some implementations, the processor unit 1310 is configured to program the PLU 1340 to provide its output signal to a peripheral 1350, 1360. In some implementations, the processor unit 1310 programs the PLU 1340 by sending commands via the peripheral bridge 1330 to the PLU 1340. Various examples of the commands include a command to program a logic element of the PLU 1340 to perform a function, a command to program a PIA of the PLU 1340 on how to interconnect logic elements, a command to set a register included in the PLU 1340, a command to set an input pathway(s), and a command to set an output pathway (s). Other types of commands are possible.

The SoC 1300 can be formed as an integrated circuit that is included in an integrated circuit package. The integrated circuit package can include electrical contacts (such as external contact pads or external pins) for external electrical connectivity. In some implementations, a portion of the electrical contacts are general purpose input output (GPIO) pins. Some of the peripheral components such as PLU 1340, peripheral-A 1350, and peripheral-B 1360 can be connected with external pins of the SoC 1300 such that a peripheral component can send signals to an external destination or receive signals from an external source. In some implementations, at least some of the peripheral components have dedicated external pins called GPIO pins 1345, 1355, 1365. GPIO pins can be configured to be input pins, output pins, or both. In some implementations, the SoC 1300 includes multiple PLUs, which can each be individually programmed.

Figure 14:
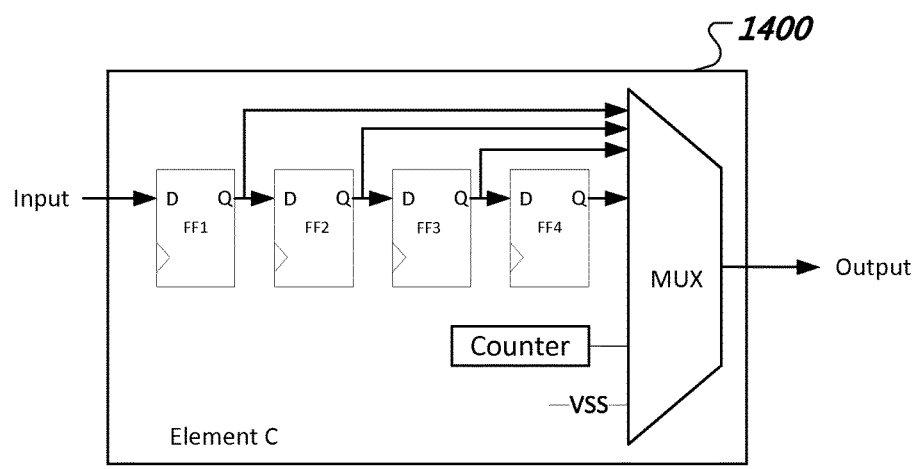
FIG. 14 shows another example of a logic element architecture.

FIG. 14 shows another example of a logic element architecture. In this example, a logic element 1400 includes circuitry for a counter, a delay element, and a filter. The counter can be associated with a TOP value, which can be pre-programmed during a programming cycle. The counter counts from 0 up to the TOP value, the output of the logic element 1400 is the value of the counter. In a first programmable mode, the counter can be programmed to never start, and always outputs a zero. In a second programmable mode, the counter can re-start. For example, based on reaching the TOP value, the counter will reset to a pre-determined value such as zero. In a third programmable mode, the counter stops at the TOP value and continues to output the TOP value.

The delay element of the logic element 1400 can include one or more flip-flops (e.g., FF1, FF2, FF3, and FF4). In some implementations, the output of the logic element 1400 programmed as a delay element is based on the n-th flip-flop, where n is the TOP value associated with the counter. For example, the output of FF1 can be used as the output of the logic element 1400 if a one cycle delay is required, whereas the output of FF4 can be used if a four cycle delay is required. In some implementations, the counter value is set to the TOP value and set to not increment or decrement this value; where a MUX controller selects a flip-flop output based on the counter value.

The filter of the logic element 1400 can include a signal that is based on a predetermined voltage source such as VSS which is zero. In some implementations, the output of the logic element 1400 programmed as a filter is based on VSS while the counter has not reached the TOP value. When the counter reaches the TOP value, the MUX command can select the n-th flip-flop as the output of the logic element 1400.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. An apparatus comprising:
one or more input interfaces;
logic elements;
one or more output interfaces;
a clock selector operable to select a clock signal from two or more clock sources; and
an interconnect array operable to:
distribute the selected clock signal to at least one of the logic elements,
route one or more input signals from the one or more input interfaces to one or more of the logic elements,
route one or more intermediate signals among the logic elements, and route one or more signals from one or more of the logic elements to the one or more output interfaces to produce one or more output signals,
the interconnect array further operable to communicatively couple a logic element programmed as a register with a logic element programmed as a decoder, wherein the logic element programmed as the decoder is operable to decode an input provided by the logic element programmed as the register via the programmable interconnect array, and wherein the logic element programmed as the decoder is operable to produce a decoded output signal as one of the one or more output signals.

2. The apparatus of claim 1, wherein the clock signal is selected by the clock selector based on whether the apparatus is operating as a master or a slave.

3. The apparatus of claim 1, wherein at least one clock source is external to the apparatus.

4. The apparatus of claim 1, wherein the interconnect array is programmable to communicatively couple a logic element programmed as a register with a logic element programmed as an encoder, and wherein the logic element programmed as the encoder is operable to encode an input provided by the logic element programmed as the register via the programmable interconnect array, and wherein the logic element programmed as the encoder is operable to produce an encoded output signal as one of the one or more output signals.

5. The apparatus of claim 1, wherein at least one of the one or more input or output signals comprises a serial bit-stream.

6. The apparatus of claim 1, wherein the logic elements comprise:
one or more logic elements that are individually programmable to provide one of a plurality of first functions; and
one or more logic elements that are individually programmable to be one of a plurality of second functions, wherein the plurality of first functions and the plurality of second functions are different by at least one function.

7. A system comprising:
processor unit configured to perform operations; and
a programmable logic unit that is communicatively coupled with the processor unit, the programmable logic unit comprising:
one or more input interfaces to receive one or more input signals;
logic elements;
one or more output interfaces to provide one or more output signals;
an interconnect array operable to form one or more interconnections within the system, route the one or more input signals from the one or more input interfaces to the logic elements, route one or more intermediate signals among the logic elements, route one or more signals from the logic elements to produce the one or more output signals via the one or more output interfaces, distribute a clock signal to at least one of the logic elements, the interconnect array operable to communicatively couple a logic element programmed as a register with a logic element programmed as a decoder, wherein the logic element programmed as the decoder is operable to decode an input provided by the logic element programmed as the register via the programmable interconnect array, and wherein the logic element programmed as the decoder is operable to produce a decoded output signal as one of the one or more output signals; and
a clock selector that is operable to select the clock signal from two or more clock sources.

8. The system of claim 7, wherein the clock signal is selected by the clock selector based on whether the programmable logic unit is operating as a master or a slave.

9. The system of claim 7, wherein at least one clock source is external to the programmable logic unit.

10. The system of claim 7, wherein the interconnect array is programmable to communicatively couple a logic element programmed as a register with a logic element programmed as an encoder, and wherein the logic element programmed as the encoder is operable to encode an input provided by the logic element programmed as the register via the programmable interconnect array, and wherein the logic element programmed as the encoder is operable to produce an encoded output signal as one of the one or more output signals.

11. The system of claim 7, wherein at least one of the one or more input or output signals comprises a serial bit-stream.

12. The system of claim 7, wherein the logic elements comprise:
one or more logic elements that are individually programmable to be one of a plurality of first functions; and
one or more logic elements that are individually programmable to be one of a plurality of second functions, wherein the plurality of first functions and the plurality of second functions are different by at least one function.

13. The system of claim 12, wherein the first functions comprise a truth table, data register, and a buffer register, and wherein the second functions comprise a counter, delay element, and a filter.

14. The system of claim 7, comprising:
a peripheral that is communicatively coupled with the programmable logic unit; and
an integrated circuit that comprises the processor unit, the programmable logic unit, and the peripheral, wherein the processor unit is operable to program the programmable logic unit to receive at least one of the one or more input signals from the peripheral, provide at least one of the one or more output signals to the peripheral, or both.

15. The system of claim 14, comprising:
electrical contacts; and
an integrated circuit package that comprises the processor unit, the programmable logic unit, and the electrical contacts, wherein the processor unit is operable to program the programmable logic unit to receive at least one of the one or more input signals from at least a portion of the electrical contacts, provide at least one of the one or more output signals to at least a portion of the electrical contacts, or both.

16. A method comprising:
sending one or more first programming commands to a programmable logic unit to program logic elements of the programmable logic unit, wherein the programmable logic unit includes one or more input interfaces to receive one or more input signals, the logic elements, one or more output interfaces to provide one or more output signals, and a programmable interconnect array, wherein the programmable interconnect array is operable to selectively form one or more interconnections within a group comprising the one or more input interfaces, the one or more output interfaces, and the logic elements;
sending one or more second programming commands to the programmable logic unit to program the programmable interconnect array to route the one or more input signals to at least a portion of the logic elements, route one or more intermediate signals among at least a portion of the logic elements, and route one or more signals from at least a portion of the logic elements to produce the one or more output signals via the output interface;
selecting a clock signal from two or more clock sources; and
distributing the clock signal to at least one of the logic elements.

17. The method of claim 16, wherein selecting a clock signal further comprises:
determining if the programmable logic unit is being operated as a master or a slave; and
responsive to the determining, selecting the clock signal from a clock source.

18. The method of claim 17, where the clock source is external to the programmable logic unit.

* * * * *